United States Patent
Liu

(12) 
(10) Patent No.: US 6,520,346 B1
(45) Date of Patent: Feb. 18, 2003

(54) MODULARIZED STRUCTURE FOR INDUSTRIAL RACK

(76) Inventor: Cheng Kuo Liu, 3F, No. 143, Sec. 3, Huan Ho S. Rd., Wan Hua Dist., Taipei (TW)

( * ) Notice: Subject to any disclaimer, the term of this patent is extended or adjusted under 35 U.S.C. 154(b) by 0 days.

(21) Appl. No.: 09/910,761

(22) Filed: Jul. 24, 2001

(51) Int. Cl.[7] .................................................. A47F 7/00
(52) U.S. Cl. ........................................................ 211/26
(58) Field of Search ........................ 211/26, 175, 162, 211/13.1; 312/265.1

(56) References Cited

U.S. PATENT DOCUMENTS 6,123,203 A * 9/2000 Gibbons
6,230,903 B1 * 5/2001 Abbott
6,279,754 B1 * 8/2001 Hoss et al.
6,305,556 B1 * 10/2001 Mayer

* cited by examiner

Primary Examiner—Alvin Chin-Shue
Assistant Examiner—Sarah Purol
(74) Attorney, Agent, or Firm—Rosenberg, Klein & Lee

(57) ABSTRACT

A modularized structure for industrial rack comprises at least a fixing frame with two brackets, an operative module, a supporting horizontal bar, an optional function module, two sliding grooves arranged on outer side of the two brackets; and two sliding members slidable in respective sliding grooves. The bracket is provided with a sliding rail and has a lug fixed to the industrial rack, whereby the modularized structure can be adapted for industrial racks of different sizes.

5 Claims, 10 Drawing Sheets

MODULARIZED STRUCTURE FOR INDUSTRIAL RACK

FIELD OF THE INVENTION

The present invention relates to a modularized structure for industrial rack, especially to a modularized structure for industrial racks of various sizes and being easily installed and maintained.

BACKGROUND OF THE INVENTION

As shown in FIGS. 1 and 2, the prior art industrial console comprises a frame 10, an operative module 11, an optional function module 12 and a cable 13.

The frame 10 has two lugs 15 on two front ends thereof for fixing the frame 10 to an industrial rack 14, as shown in FIG. 2. The operative module 11 and the optional function module 12 are enclosed by the frame 10. The operative module 11 has a plurality of operative buttons and displays (not shown) and the optional function module 12 has a plurality of interfaces (not shown) for user. The operative module 11 and the optional function module 12 are connected by the cable 13 to provide data transmission therein.

The industrial rack 14 is generally of rectangular shape and the frame 10 is provided with two lugs 15 for fixing on the industrial rack 14. As shown in FIG. 2, the frame 10 is slantingly placed into the industrial rack 14 due to the projecting lugs 15. The assembling thereof occupies large space and is cumbersome.

The industrial rack 14 generally has standard size of 500–950 mm. The frame 10 has also standard size and is assembled to the industrial rack 14. The industrial rack 14 has problem to be adapted to frames 10 with different sizes.

Moreover, in above-mentioned industrial console, the operative module 11 and the optional function module 12 are not separable. In other word, each optional function module 12 is assembled with an operative module 11. The operative module 11 is generally provided with expensive LCD panel. Therefore, operative modules 11 with numbers equal to that of the optional function module 12 are required to assemble integral industrial console even though only part of the interfaces of the optional function module 12 are used. The provision of the operative modules 11 wastes considerable cost.

SUMMARY OF THE INVENTION

It is the object of the present invention to provide a modularized structure for industrial racks of various sizes and being easily installed and maintained.

In one aspect of the present invention, the modularized structure for industrial racks according to the present invention has a fixing frame composed of two brackets and each bracket having corresponding sliding rail. The modularized structure for industrial rack further comprising two sliding grooves arranged on outer side of the two brackets, and two sliding members slidable in respective sliding grooves, whereby the modularized structure can be adapted for industrial racks of different sizes.

In another aspect of the present invention, the modularized structure for industrial racks according to the present invention has an optional function module with easy assembling and disassembling feature. The buttons and LCD on the optional function module can be flexibly utilized and the cost of purchase is reduced.

To achieve above object, the present invention provides a modularized structure for industrial rack having at least a fixing frame with two brackets, an operative module, a supporting horizontal bar, an optional function module, two sliding grooves arranged on outer side of the two brackets; and two sliding members slidable in respective sliding grooves. The bracket is provided with a sliding rail and has a lug fixed to the industrial rack. Each of the fixing frames has a first locking element engaged with the supporting horizontal bar and the operative module is screwed to front side of the supporting horizontal bar by a plurality of screws. Therefore, the modularized structure can be adapted for industrial racks of different sizes.

The various objects and advantages of the present invention will be more readily understood from the following detailed description when read in conjunction with the appended drawing, in which:

DETAILED DESCRIPTION OF THE INVENTION

Figure 1:
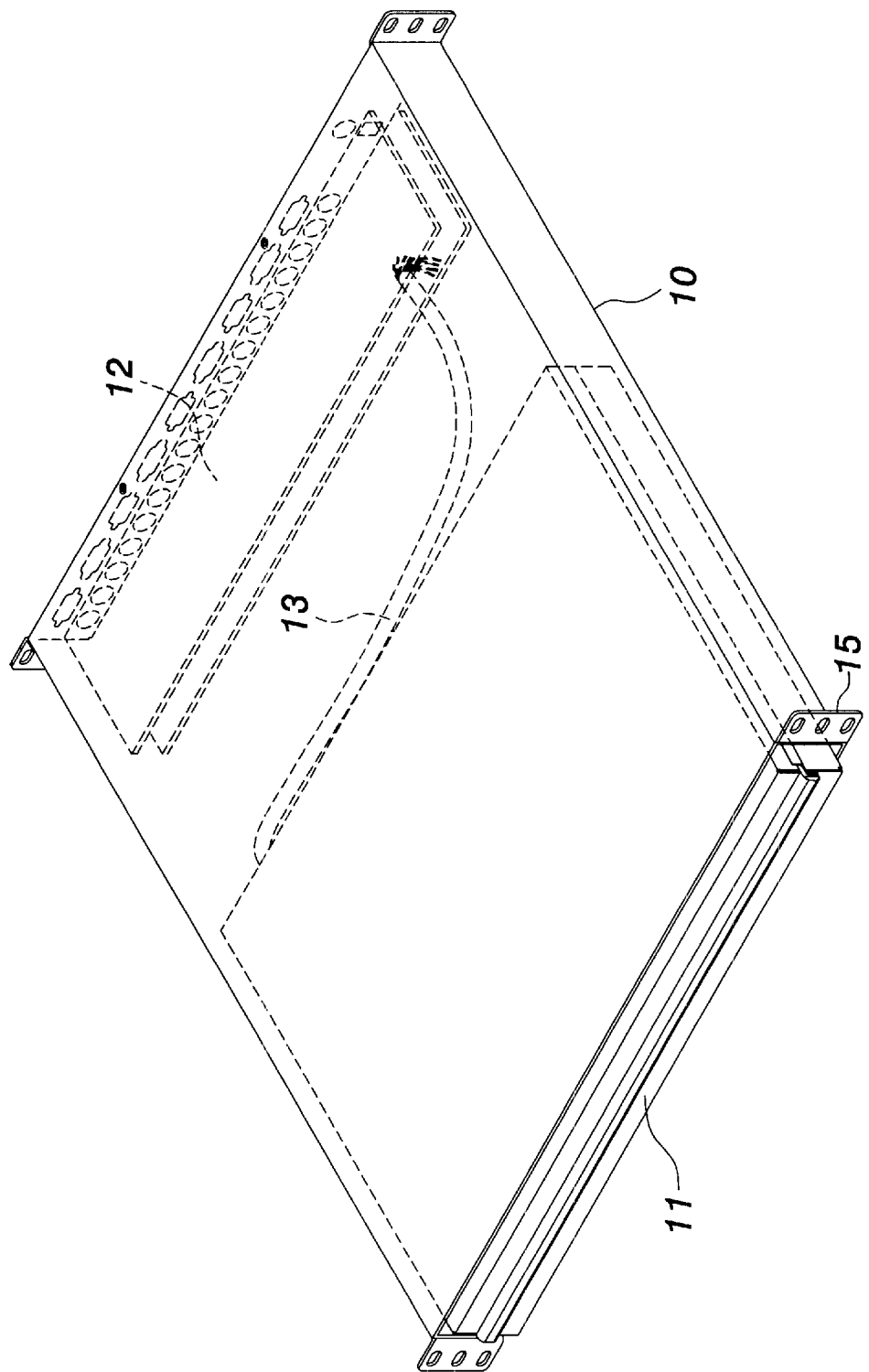
FIG. 1 shows a perspective view of prior art industrial console.
Figure 2:
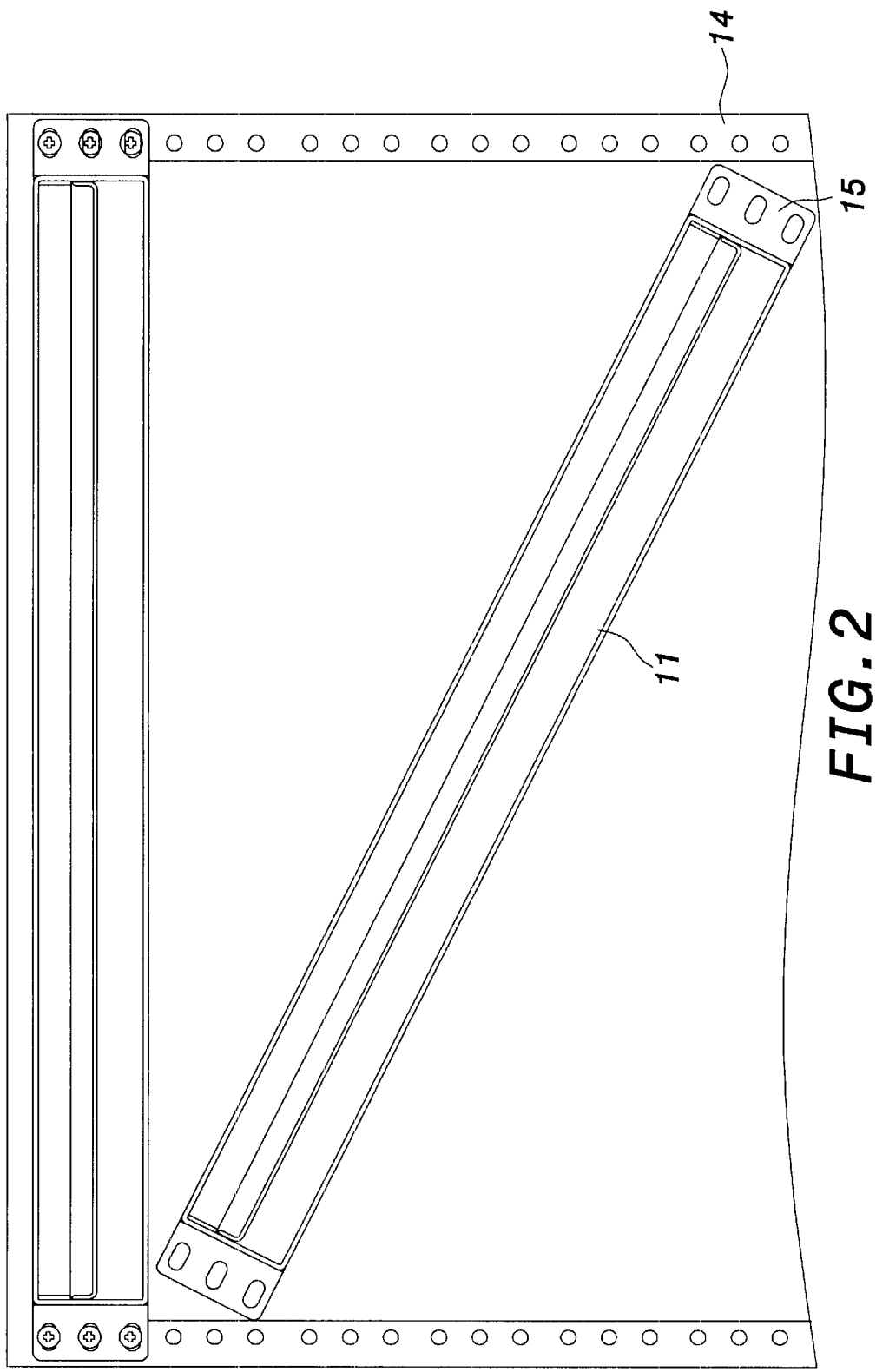
FIG. 2 is a sectional view showing the assembling of the prior art industrial console.

With reference now to FIGS. 3 to 10, the present invention is intended to provide a modularized structure for industrial rack to save cost and providing multiple functions. The modularized structure of the present invention comprises a fixing frame 20, an operative module 30, a supporting horizontal bar 40, an optional function module 50, two sliding blocks 60, and two sliding grooves 50.

Figure 9:
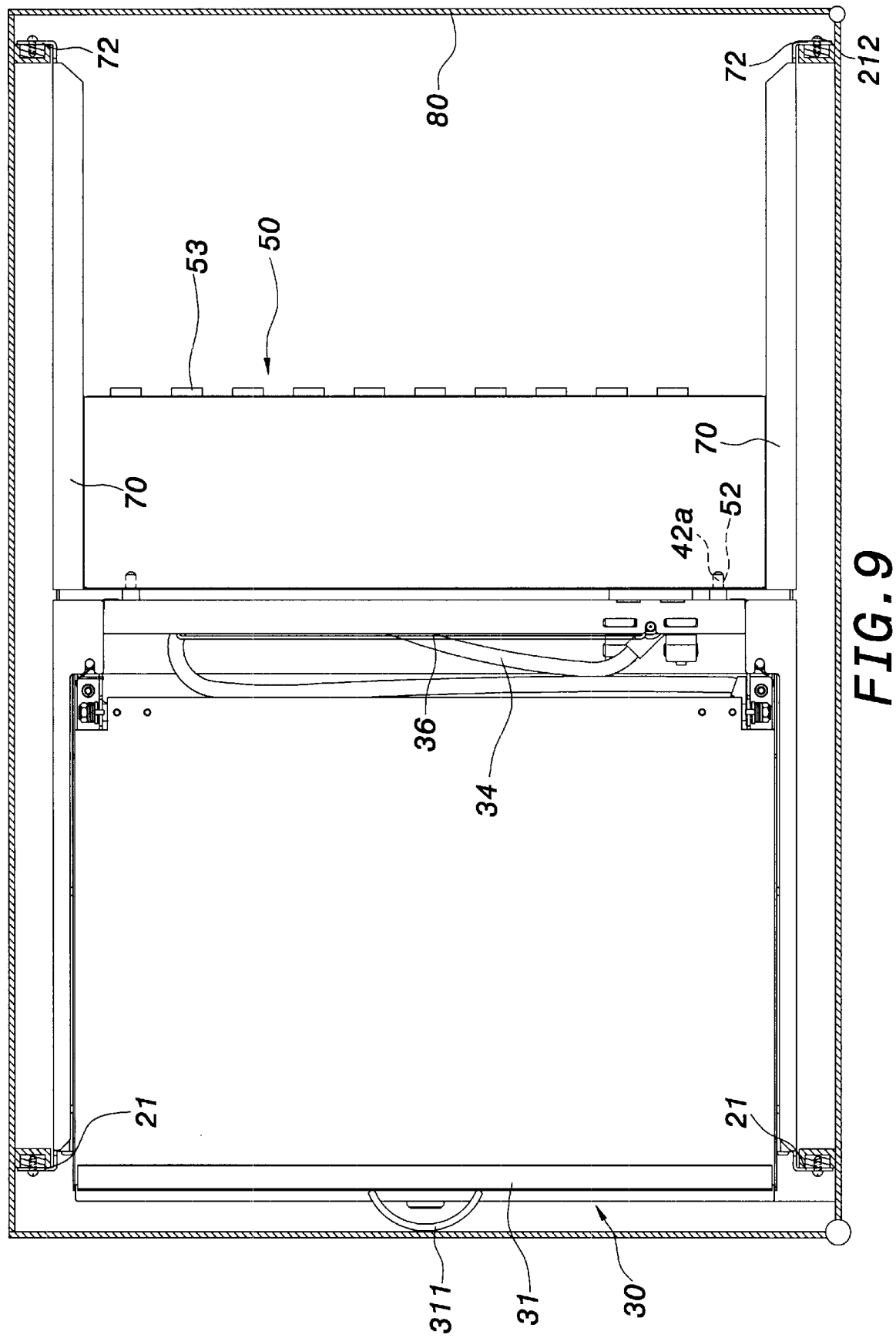
FIG. 9 shows a top view of the second preferred embodiment of the present invention.
Figure 10:
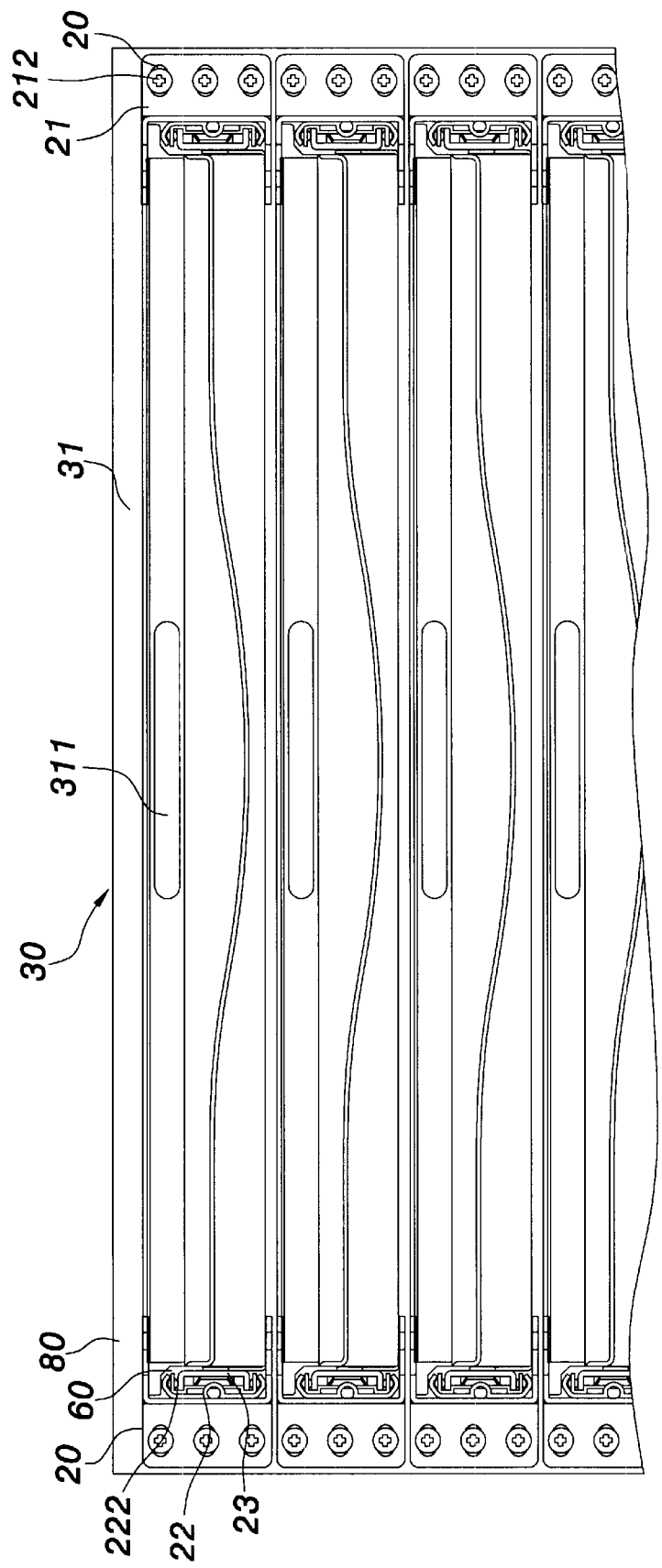
FIG. 10 shows the operation of the present invention.

The fixing frame 20 is made of metal and composed of two brackets and assembled to an industrial rack 80, as shown in FIG. 9. The fixing frame 20 has two first lugs 21 at two front ends thereof and fixed to two front ends of the industrial rack 80 for assembling the fixing frame 20. Each of the first lugs 21 has a plurality of fixing holes 211 fixed to the industrial rack 80 by corresponding fixing elements 212 as shown in FIG. 10, whereby the fixing frame 20 is substantially fixed in the industrial rack 80 as shown in FIG. 9.

Figure 3:
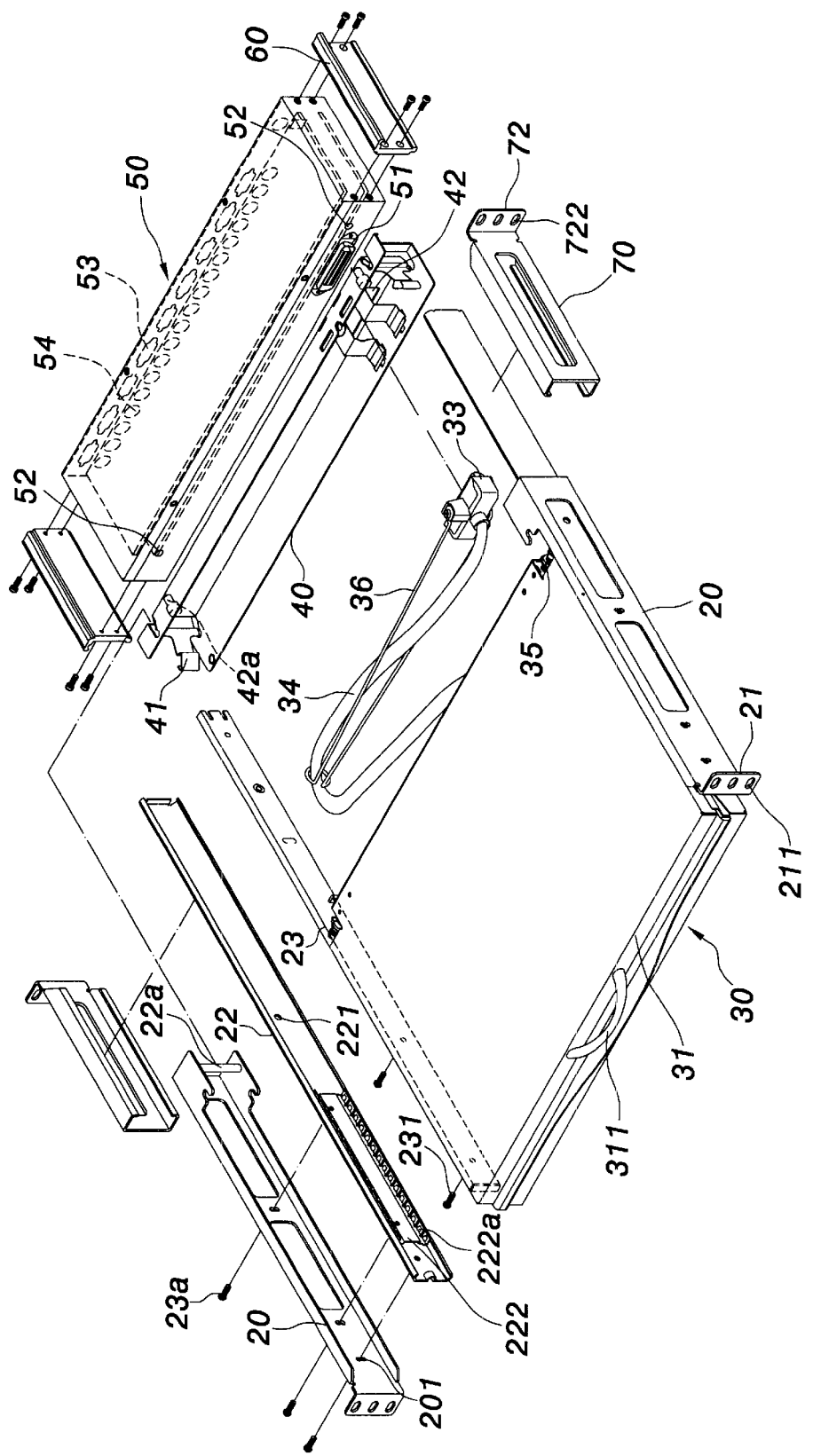
FIG. 3 shows an exploded view of the present invention.
Figure 4:
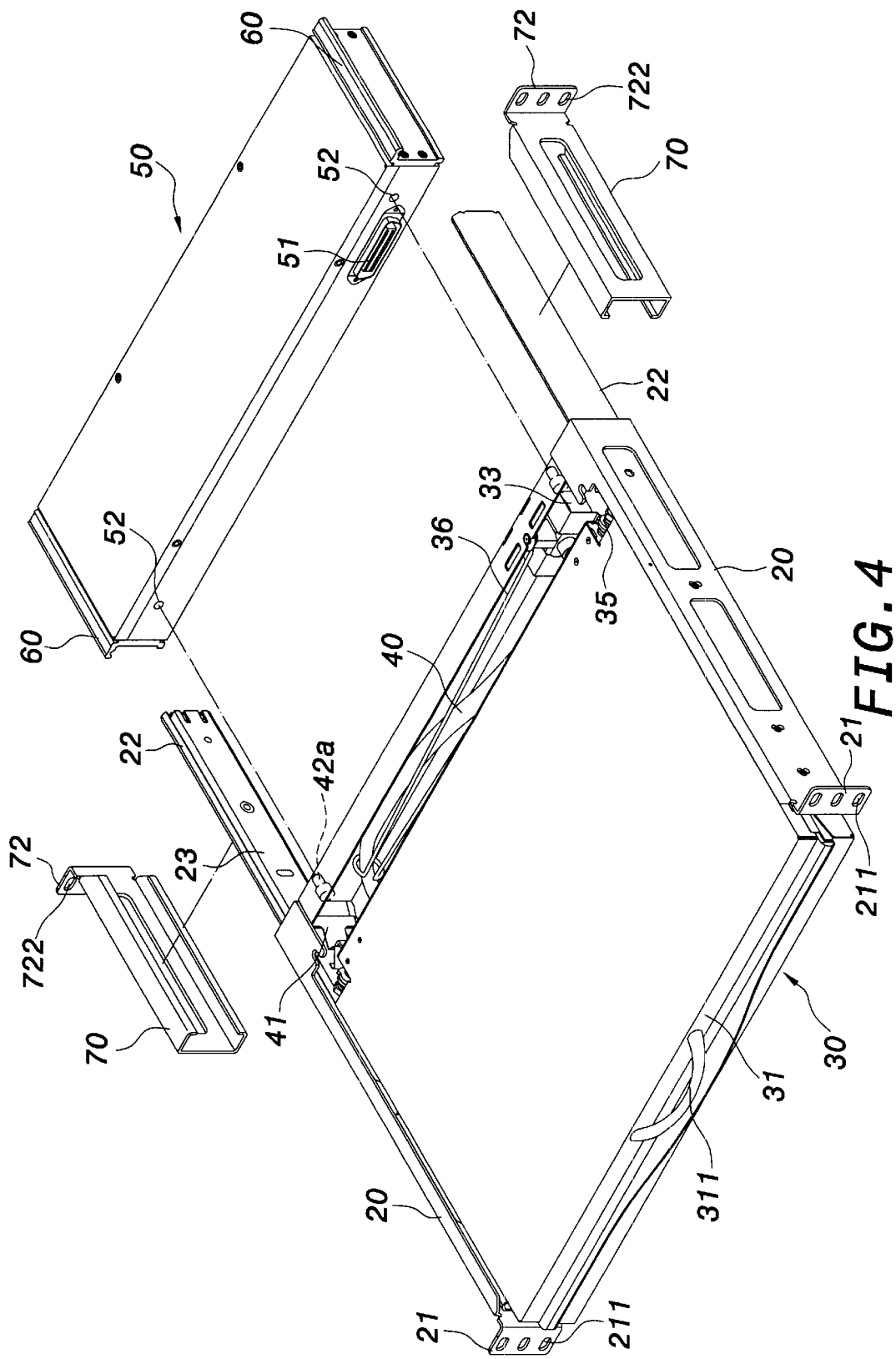
FIG. 4 shows another exploded view of the present invention.
Figure 5:
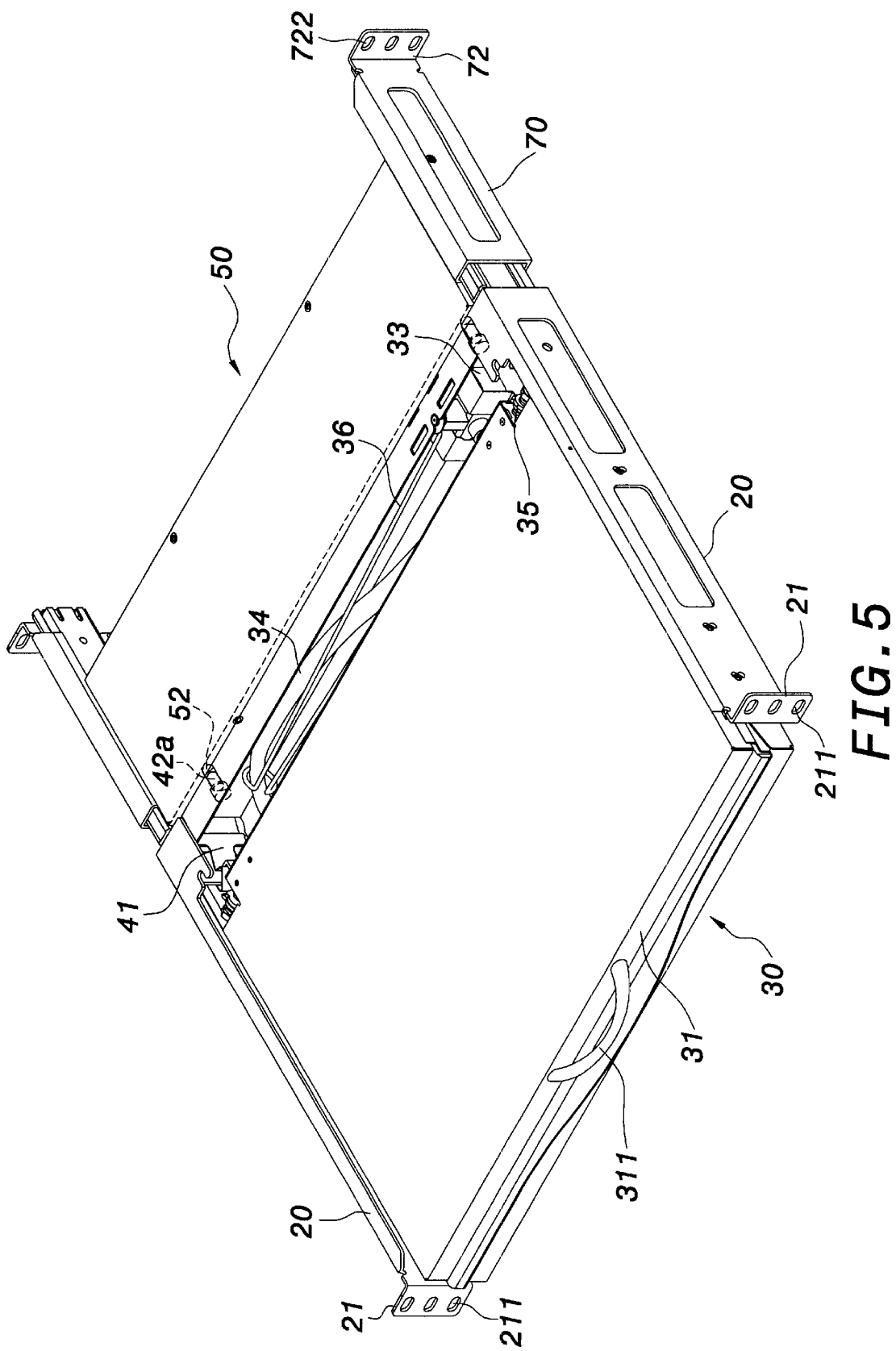
FIG. 5 shows a perspective view of the present invention.

The fixing frames 20 has two first locking elements 22a on rear side thereof and each engaged with a second locking element 41 formed on the supporting horizontal bar 40 as shown in FIGS. 3 and 4. The first locking element 22a and the second locking element 41 facilitate the assembling of the fixing frame 20 to the supporting horizontal bar 40. Therefore, the operative module 30 and the optional function module 50 can be assembled at front side and back side of the supporting horizontal bar 40, respectively, as shown in FIG. 5.

The fixing frame 20 has a plurality of holes 201, and two sliding rails 22 have corresponding holes 221 such that the fixing frame 20 can be assembled with the sliding rails 22 by screwing the holes 201 and 221 with fixing members 23a such as screw, pin or rivets, as shown in FIG. 4.

The sliding rail 22 has length corresponding to the industrial rack 80 with about 500–950 mm sizes. The sliding rail 22 has a sliding plate 222 with a plurality of rolling balls 222a to facilitate the sliding plate 23 rolling in the sliding rail 22. The sliding plate 222 is also fit to a sliding shaft 23 and the balls 222a also facilitate the sliding plate 222 rolling in the sliding shaft 23. The sliding shaft 23 is fixed to the operative module 30 by a plurality of screws 231.

The operative module 30 is composed of an upper cover 31 and a lower cover 32 pivotally connected through a pivotal part 35. The upper cover 31 can be opened through the pivotal part 35. The operative module 30 contains a plurality of buttons (not shown) and LCD panels (not shown) therein and the upper cover 31 has an arc-shaped handle 311 on front side thereof to facilitate the user to open the upper cover 31.

The sliding plate 23 has a rear side screwed to the sliding groove 70 by a plurality of screws 71 as shown in FIG. 4. The sliding groove 70 has a second lug 72 with a plurality of holes 722 screwed by fixing members (not shown) to lock the sliding groove 70 on the industrial rack 80.

The sliding members 60 are slidably fit into the sliding grooves 70, as shown in FIGS. 5. The sliding members 60 can be slid out of the sliding grooves 70 to replace the optional function module 50 screwed to the sliding members 60.

As shown in FIG. 4, the optional function module 50 is screwed to the sliding members 60 by a plurality of screws 61 such that the optional function module 50 is arranged on inner sides of the sliding grooves 70 in a detachable fashion.

The optional function module 50 has a plurality of interfaces (not shown) for user and a first connector 51 at front side thereof, as shown in FIG. 4. The first connector 51 has outer flange fit with an opening 42 on the supporting horizontal bar 40. The first connector 51 passes through the opening 42 and is connected to a third connector 33 on the operative module 30. The operative module 30 has a transmission cable 34 through which the signal from the optional function module 50 can be sent to the operative module 30. More particularly, the interfaces of the optional function module 50 communicate the buttons and display panel of the operative module 30 through the first connector 51, the transmission cable 34 and the third connector 33 to facilitate data accessing of the optional function module 50.

Figure 6:
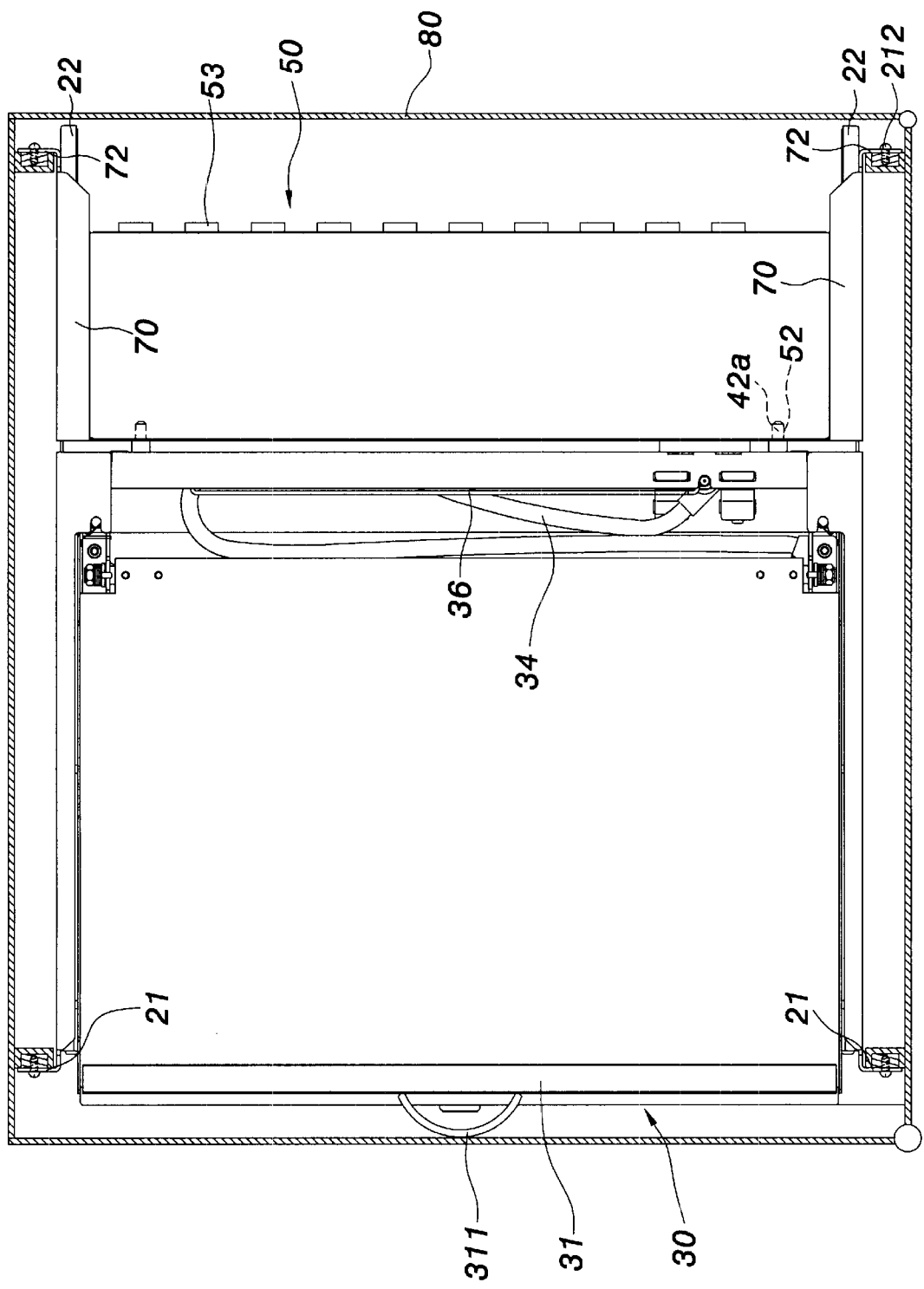
FIG. 6 shows a top view of the present invention.

The present invention further has a cable fixer 36 to fix the cable 34 such that the cable 34 is retained between the operative module 30 and the optional function module 50, as shown in FIG. 6. The cable fixer 36 has one end pivotally connected to the case of the third connector 33, as shown in FIG. 3. The cable fixer 36 prevents the cable 34 from entanglement due to operation of the operative module 30 and the optional function module 50.

The optional function module 50 has a locking groove 52 on front side thereof and is fit to a corresponding locking bump 42a on the supporting horizontal bar 40, as shown in FIGS. 3 and 4. The locking groove 52 is locked with the locking bump 42a, as shown in FIG. 4, to enhance the assembling force between the supporting horizontal bar 40 and the optional function module 50 and prevent the detaching of the first connector 51 from the third connector 33. Therefore, the interfaces of the optional function module 50 have confidential connection with the operative module 30.

The optional function module 50 has a plurality of second connectors 53 and a plurality of connection ports 54 on rear side thereof to provide the optional function module 50 with external connection, expansion and update ability.

Figure 7:
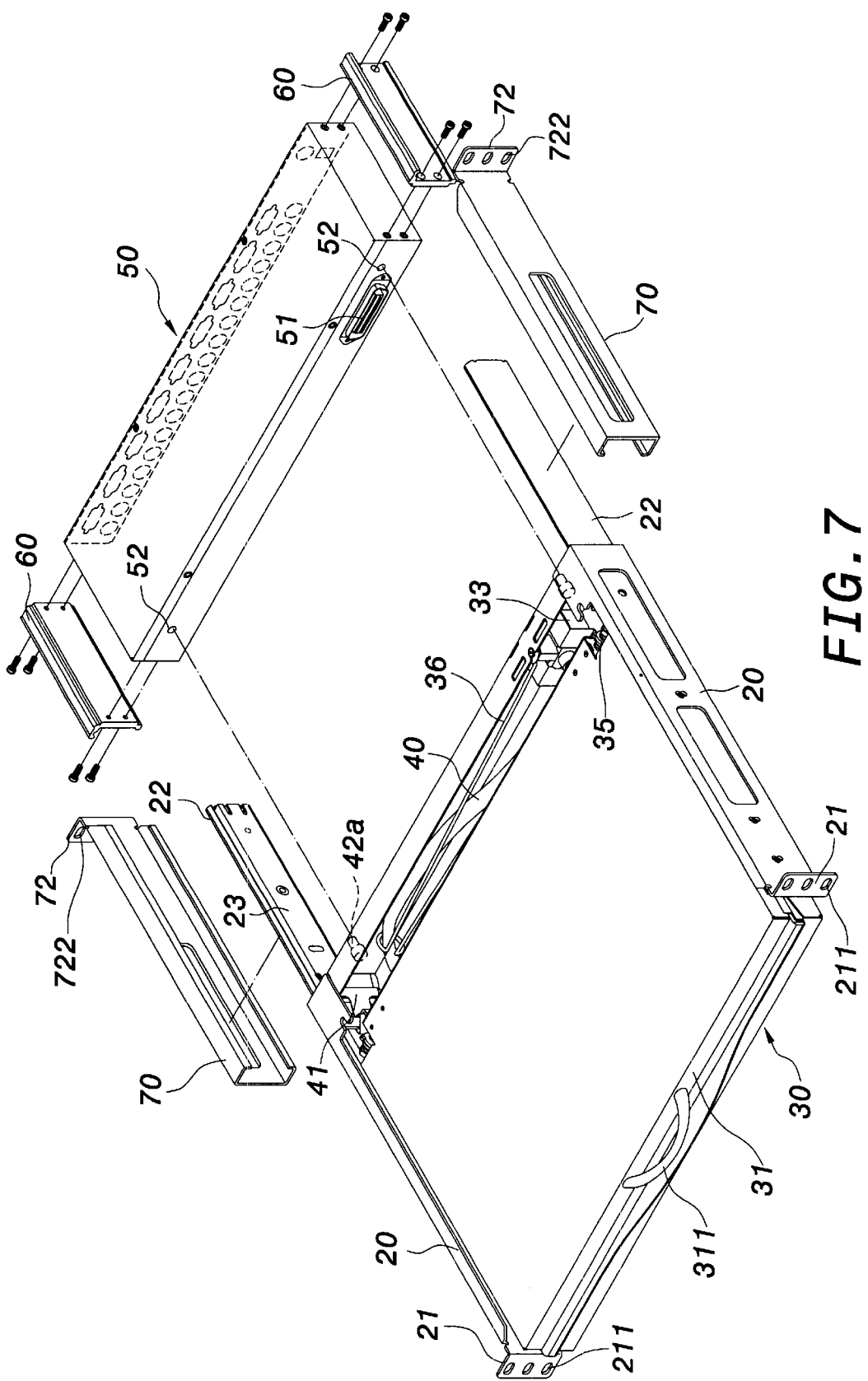
FIG. 7 shows another exploded view of the second preferred embodiment of the present invention.
Figure 8:
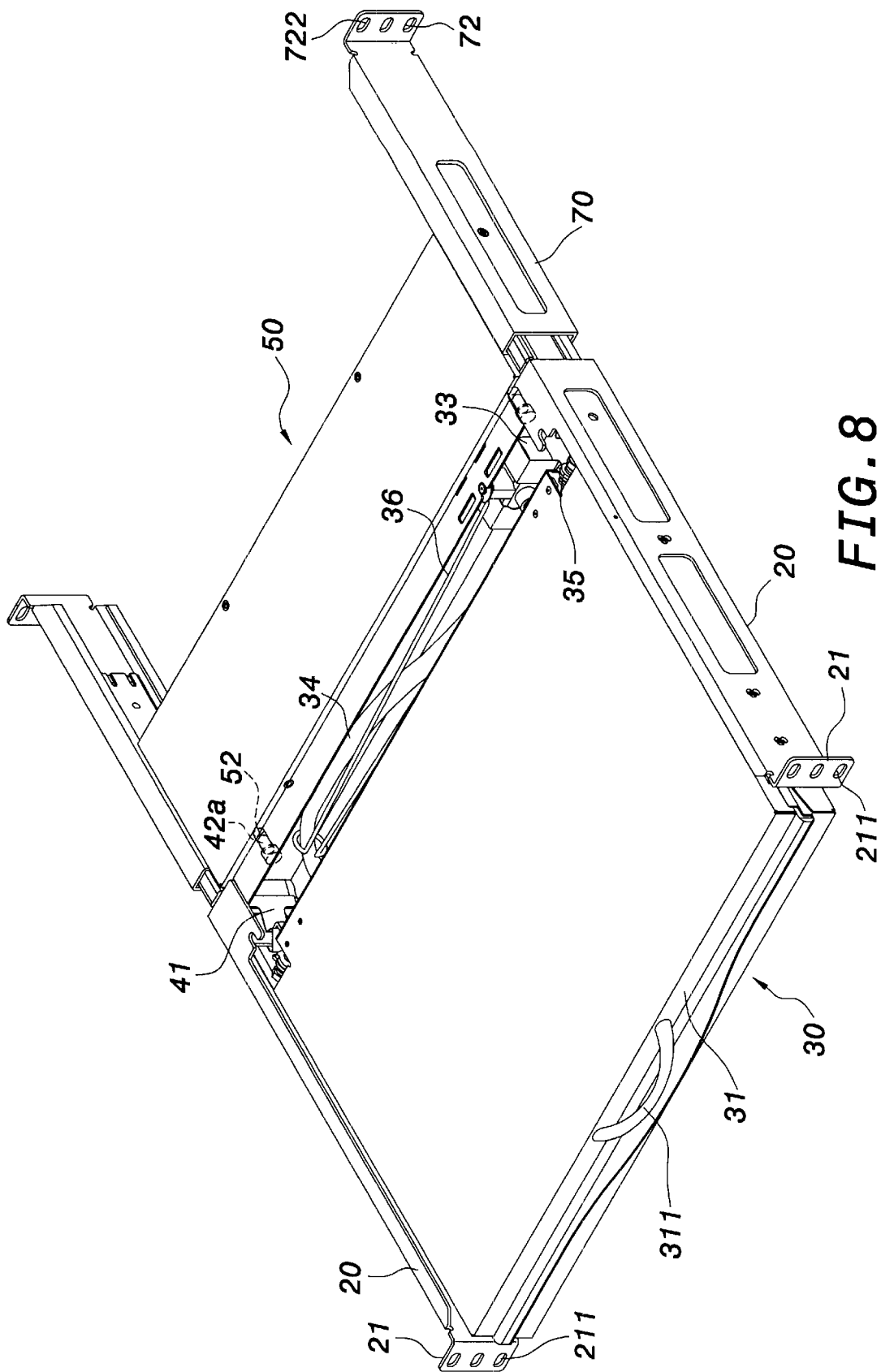
FIG. 8 shows a perspective view of the second preferred embodiment of the present invention.

As shown in FIGS. 7, 8, and 9, the length of the modularized structure including the sliding rails 22, the optional function module 50, and the two sliding members 60 can be increased or decreased with respect to the length of the operative module 30, the optional function module 40 and the industrial rack 80. Therefore, the modularized structure can be adapted to the LCD panel of different sized in the operative module 30. Alternatively, the length of the optional function module 50 can also be increased or decreased to modify the interfaces thereof and to fit the standard 500–950 mm industrial rack 80.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A modularized structure for an industrial rack, comprising:

a fixing frame having a pair of brackets;

a pair of sliding groove members positioned adjacent respective ones of said pair of brackets;

a pair of sliding members slidably received in respective sliding groove members, each of said sliding members being fixed to a respective one of said brackets;

a pair of sliding rails, each of said sliding rails being selectively and removably mounted on a respective one of said sliding members; and, a supporting horizontal bar selectively and removably fixed to said pair of brackets for selective support of an optional function module.

2. The modularized structure for an industrial rack as recited in claim 1, wherein each of said brackets has a lug formed on one side thereof to facilitate said bracket being fixed on said industrial rack.

3. The modularized structure for an industrial rack as recited in claim 1, wherein each of said brackets has a plurality of holes formed therethrough, said holes receiving a plurality of fixing members for securing said sliding rails to said brackets.

4. The modularized structure for an industrial rack as recited in claim 1, wherein an operative module is positioned on a first side of said supporting horizontal bar, said optional function module being detachably arranged on a second opposed side of said supporting horizontal bar.

5. The modularized structure for an industrial rack as recited in claim 3, wherein said sliding rails have a selectively adjustable length.

* * * * *